United States Patent
Arai

(10) Patent No.: US 8,216,920 B2
(45) Date of Patent: Jul. 10, 2012

(54) SILICON EPITAXIAL WAFER AND MANUFACTURING METHOD THEREOF

(75) Inventor: Takeshi Arai, Nishishirakawa (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 12/866,946

(22) PCT Filed: Feb. 27, 2009

(86) PCT No.: PCT/JP2009/000889
§ 371 (c)(1),
(2), (4) Date: Aug. 10, 2010

(87) PCT Pub. No.: WO2009/116233
PCT Pub. Date: Sep. 24, 2009

(65) Prior Publication Data
US 2010/0327415 A1 Dec. 30, 2010

(30) Foreign Application Priority Data
Mar. 17, 2008 (JP) ................................. 2008-068069

(51) Int. Cl.
*H01L 21/20* (2006.01)
(52) U.S. Cl. .................. 438/478; 257/E21.09
(58) Field of Classification Search .................. None
See application file for complete search history.

(56) References Cited

U.S. PATENT DOCUMENTS

| 5,242,501 A | 9/1993 | McDiarmid |
| 7,377,978 B2 * | 5/2008 | Nishizawa ............... 117/88 |
| 2004/0241992 A1 | 12/2004 | Kono et al. |
| 2006/0180086 A1 | 8/2006 | Kanaya et al. |

FOREIGN PATENT DOCUMENTS

| JP | A-59-50095 | 3/1984 |
| JP | A-5-238882 | 9/1993 |
| JP | A-7-58039 | 3/1995 |
| JP | A-2003-100855 | 4/2003 |
| JP | A-2004-319623 | 11/2004 |
| JP | A-2005-5490 | 1/2005 |
| JP | A-2005-235906 | 9/2005 |

OTHER PUBLICATIONS

International Search Report issued in International Application No. PCT/JP2009/000889 (with translation).

* cited by examiner

*Primary Examiner* — Seahvosh Nikmanesh
(74) *Attorney, Agent, or Firm* — Oliff & Berridge, PLC

(57) ABSTRACT

Provided is a method for manufacturing a silicon epitaxial wafer by growing an epitaxial layer by placing a silicon substrate on a susceptor. The method includes at least a step of forming a silicon oxide film entirely on the rear surface of the silicon substrate; a step of removing the silicon oxide film formed at least on an edge section of the silicon substrate; and a step of placing the silicon substrate on the susceptor with the silicon oxide film in between. An epitaxial layer is grown on the silicon substrate, while holding the silicon substrate by the susceptor with the silicon oxide film in between. Thus, the silicon epitaxial wafer by which generation of particles can be reduced in a device manufacturing process and a method for manufacturing such silicon epitaxial wafer are provided.

2 Claims, 3 Drawing Sheets

SILICON EPITAXIAL WAFER AND MANUFACTURING METHOD THEREOF

TECHNICAL FIELD

The present invention relates to a method for manufacturing a silicon epitaxial wafer by placing a substrate on a susceptor and growing a silicon epitaxial layer in an epitaxial growth apparatus and to a silicon epitaxial wafer manufactured by this method.

BACKGROUND ART

An epitaxial growth technology is a technology for epitaxially growing a single-crystal thin film layer in vapor phase, which is utilized in manufacture of an integrated circuit such as a bipolar transistor or an MOSLSI, and it is a very important technology since a uniform single crystal thin film can be grown on a clean semiconductor single crystal substrate in accordance with a crystal orientation of the substrate or a precipitous impurity gradient of a junction having a large dopant concentration difference can be formed.

As apparatuses that perform such epitaxial growth, three types, i.e., a vertical type (a pancake type), a barrel type (a cylinder type) and a lateral type are general. These growth apparatuses have a common basic principle. Each growth apparatus is configured to include a reaction chamber including an epitaxial growth susceptor on which a single-crystal silicon substrate is placed, heating means formed of, e.g., a halogen lamp provided outside the reaction chamber and others, and an apparatus that processes wafers one by one in vertical type apparatuses is called a single-wafer processing epitaxial growth apparatus.

For example, this single-wafer processing epitaxial growth apparatus will now be described with reference to FIG. 4. FIG. 4 is a schematic view showing an example of a conventionally utilized general single-wafer processing epitaxial growth apparatus.

This single-wafer processing epitaxial growth apparatus 41 has a reaction chamber 43 in which a silicon substrate 42 on which an epitaxial layer is piled up on a surface thereof is arranged therein, and a gas introduction opening 44 from which a raw material gas/carrier gas is introduced to the reaction chamber 43 and a gas discharge opening 45 from which the gas is discharged are provided. Further, the reaction chamber 43 includes a susceptor 46 on which the silicon substrate 42 is placed.

Furthermore, at least heating means 48, e.g., a halogen lamp for heating the silicon substrate 42 is provided outside the reaction chamber 43.

Moreover, giving a description on a general method for forming an epitaxial layer on the silicon substrate 42 by using the single-wafer processing epitaxial growth apparatus 41 depicted in FIG. 4, this method is carried out by first placing the single-crystal silicon substrate 42 on the susceptor 46, heating the substrate 42 to a predetermined temperature by the heating means 48 while rotating the silicon single crystal substrate 42 by using a support shaft 49 that supports the susceptor 46 and a non-illustrated rotation mechanism that rotates the support shaft 49 (rotates the same on its axis), and supplying a raw material gas such as trichlorosilane diluted with a carrier gas such as hydrogen into the reaction chamber 43 from the gas introduction opening 44 for a predetermined time at a predetermined flow quantity. As a result, a silicon epitaxial wafer having an epitaxial layer piled up on the substrate 42 can be obtained.

Although the quality has been conventionally improved in manufacture of the silicon epitaxial wafer, a pocket formed in the susceptor is deformed as one of such improving methods. For example, Japanese Patent Application Laid-open No. S59-50095 discloses various susceptors. Such susceptors can be roughly classified into a type that supports a substantially entire back surface of a substrate and a type that supports a part of the substrate alone (see, e.g., Japanese Patent Application Laid-open No. S59-50095, Japanese Patent Application Laid-open No. H5-238882, Japanese Patent Application Laid-open No. H7-58039, and Japanese Patent Application Laid-open No. 2004-319623).

As the type that supports a substantially entire back surface of a substrate, there are a susceptor having a configuration that a pocket has a flat bottom surface, a susceptor having a configuration that a cylindrical convex portion having a diameter smaller than a diameter of a substrate to be placed is formed on a bottom surface of a pocket, a susceptor having a configuration that a portion that comes into contact with the substrate has a mesh-like shape, and others.

However, this kind of susceptor comes into contact with the substantially entire back surface of the substrate, and hence it has a problem that a placing surface (the back surface) of the substrate is damaged. Further, when scratches remain on the back surface of the substrate, they become a cause of particle generation in a subsequent device manufacturing process.

On the other hand, as the type that supports a part of the substrate alone, there are a susceptor having a configuration that a ring-like convex portion is formed at an inner side apart from an edge portion of a substrate to be placed, and a susceptor having a configuration that a concave portion is formed at a central portion of a pocket to hold an outer peripheral portion (an inner side apart from an edge portion) of the substrate where a device is not fabricated.

However, although such a type of susceptor does not damage the entire back main surface of the substrate, but it supports the substrate at a part alone, and hence there is a problem that a scratch at a contact portion is deep, the substrate bends or slip occurs from the edge portion of the substrate.

Further, Japanese Patent Application Laid-open No. 2005-235906 discloses a susceptor which has a configuration that an inclined surface is formed at an outer periphery of a pocket and which supports a substrate in such a manner that an edge portion of the substrate comes into contact with the inclined surface to reduce scratches generated on a back surface of the substrate. Furthermore, Japanese Patent Application Laid-open No. 2003-100855 discloses that a silicon oxide film is formed on a back surface of a substrate so as to prevent the back surface of the substrate from being damaged by lift pins.

However, even though the ingenuity is exercised with respect to the substrate supporting method in this manner, the problem of particle generation in the device manufacturing process still arises.

DISCLOSURE OF INVENTION

In view of the above-described problem, it is an object of the present invention to provide a silicon epitaxial wafer and a manufacturing method thereof that can reduce particle generation in a device manufacturing process.

To achieve this object, according to the present invention, there is provided a method for manufacturing the silicon epitaxial wafer by placing a silicon substrate on a susceptor to grow an epitaxial layer, the method comprising at least: a step of forming a silicon oxide film on an entire back surface of the silicon substrate; a step of removing at least a silicon oxide film formed on an edge portion of the silicon substrate; and a step of placing the silicon substrate on the susceptor through the silicon oxide film, wherein the epitaxial layer is grown on the silicon substrate while holding the silicon substrate on the susceptor through the silicon oxide film.

Moreover, according to the present invention, there is provided a silicon epitaxial wafer comprising an epitaxial layer grown on a silicon substrate, wherein at least an edge portion and a region extending 1 mm from an outer periphery of a back main surface toward an inner side of the silicon substrate has no contact scratches generated due to a susceptor, and an entire back surface of the silicon substrate having no contact scratches generated due to the susceptor is particularly preferable.

When the substrate having the silicon oxide film on the back main surface excluding the edge portion of the substrate is placed on the susceptor through the silicon oxide film to form the epitaxial layer in this manner, the epitaxial layer can be grown without generating contact scratches by the susceptor on at least the edge portion of the substrate and the region that is 1 mm inside from the outer periphery of the back main surface or the entire back surface, and the particle generation from the substrate can be suppressed in a subsequent process. Therefore, a yield ratio of wafer manufacture or subsequent device manufacture and a quality can be improved.

Additionally, it is preferable that, when the silicon substrate contains a dopant, a region from which the silicon oxide film is to be removed is determined to extend at most 1 mm from an outer periphery of a back main surface toward an inner side at the step of removing the silicon oxide film.

When the silicon substrate contains the dopant in this manner, autodoping from the back surface of the silicon substrate can be suppressed during the growth of the epitaxial layer by restricting the silicon oxide film to be removed to the region extending at most 1 mm from the outer periphery toward the inner side of the back main surface.

In this case, it is preferable to carry out the step of removing the silicon oxide film by mirror polishing and also preferable for the edge portion of the silicon substrate to be a mirror finished surface.

As described above, the silicon oxide film on the edge portion can be accurately removed by mirror polishing, and the silicon epitaxial wafer with no particle generation can be manufactured when the edge portion of the silicon substrate is the mirror finished surface.

Further, it is preferable to carry out the step of forming the silicon oxide film by a CVD method.

When the silicon oxide film is formed on the entire back surface of the silicon substrate by the CVD method in this manner, the CVD silicon oxide film can be readily formed, and the silicon oxide film can be easily removed after growing the epitaxial layer.

The silicon epitaxial wafer and the manufacturing method thereof according to the present invention can grow the epitaxial layer without contact scratches generated due to the susceptor on the back surface of the silicon substrate, and the particle generation from the substrate can be suppressed in a subsequent process. Therefore, a yield ratio of wafer manufacture or even device manufacture and a quality of a wafer product can be improved.

BEST MODE(S) FOR CARRYING OUT THE INVENTION

Figure 1:
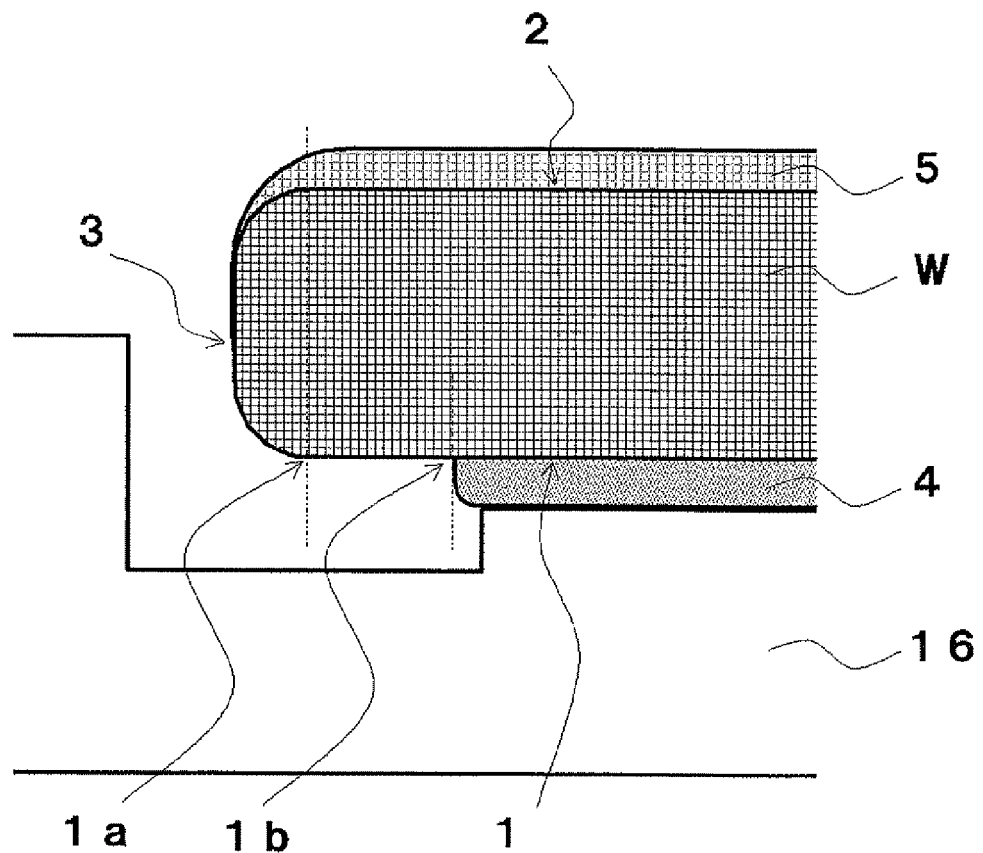
FIG. 1 is a cross-sectional view showing particulars of a contact relationship with respect to a susceptor in a method for manufacturing a silicon epitaxial wafer according to the present invention.

As particle generation in manufacture of an epitaxial wafer or subsequent manufacture of device, particle generation directly occurs from polysilicon deposited on an edge portion or scratches present on a substrate, and particle generation also occurs when a silicon oxide film remains in scratches in a process of forming/removing a film, e.g., the silicon oxide film and this film is delaminated. Therefore, various susceptors have been conventionally developed. However, no matter how often a method for supporting a substrate on a susceptor is changed, the problem of particle generation in a device manufacturing process cannot be solved.

The present inventor has keenly conducted studies about scratches on a substrate that can be a cause of the particle generation.

At the present, to manufacture a silicon epitaxial wafer having a diameter exceeding 300 mm, contact scratches generated by a susceptor are prevented from being generated by using a susceptor to support a portion near an outer periphery (an inner side apart from an edge portion) of a back main surface of a silicon substrate. However, even if such a supporting method is adopted, scratches are generated at contact points with respect to the susceptor.

In a susceptor which is of a type that comes into contact with an outer periphery of a back main surface of a substrate for support, when the substrate is placed and a temperature is increased to 1100° C. in a hydrogen atmosphere, the susceptor and the substrate are locally attached to each other, attachment points are then delaminated by reducing the temperature, and delaminated portions become scratches.

Observing each of the scratches by using an electron microscope, it was discovered that the scratch includes a deep crack. Although a scratch generating position differs depending on a contact angle with respect to the susceptor, the scratch is generated in a region having a width of 1 mm from a back main surface in case of the susceptor configured in such a manner that an inclination of a substrate disposing portion formed at an outer peripheral portion of a pocket is, e.g., 1°, and a contact point with respect to the susceptor is sifted toward the inner side apart from the outer periphery of the back main surface and the scratch is likewise generated at the contact point due to delamination when the angle of the disposing portion is shallowed.

As scratch preventing means, protecting a contact portion with respect to the susceptor by using, e.g., a CVD oxide film can be considered like Japanese Patent Application Laid-open No. 2003-100855. However, when the susceptor that supports the silicon substrate at the outer periphery of the back main surface is used, the CVD oxide film is present on the outer periphery of the back main surface and also present on the edge portion, which is not preferable. That is because presence of the silicon oxide film on the edge portion for prevention of scratches causes polysilicon to grow on the silicon oxide film during growth of an epitaxial layer, which becomes a cause of particle generation by contraries.

Thus, the present inventor has further repeatedly conducted studies and conceived of an idea of preventing the silicon substrate from directly coming into contact with the susceptor and avoiding growth of polysilicon in order to manufacture a silicon epitaxial wafer without scratching the back surface of the substrate on which the epitaxial layer is grown and to provide the silicon epitaxial wafer that causes no particle generation even in subsequent processes, thereby bringing the present invention to completion.

An embodiment according to the present invention will now be described hereinafter with reference to the drawings, but the present invention is not restricted thereto.

Figure 3:
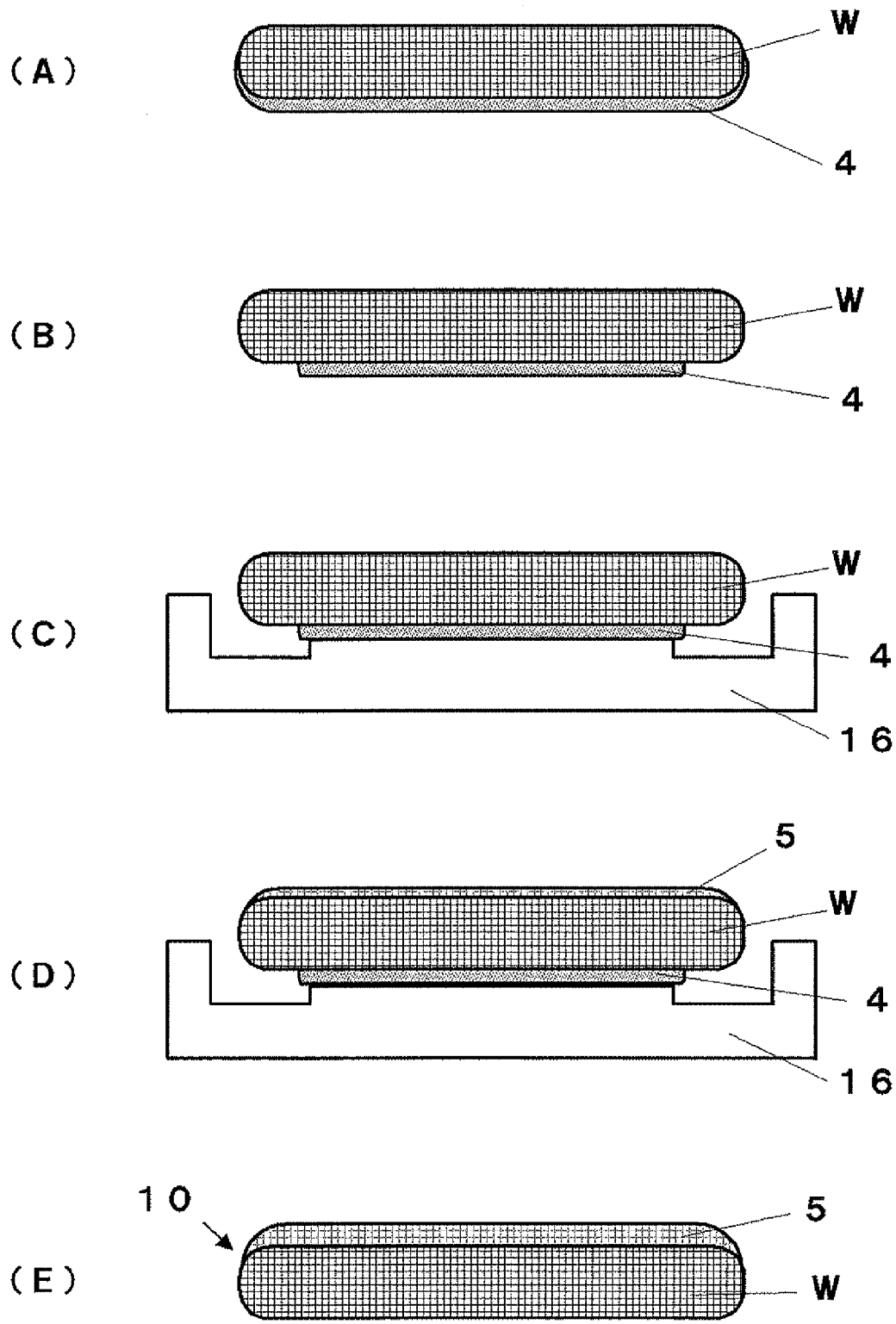
FIG. 3 is a view for explaining a process flow in the method for manufacturing a silicon epitaxial wafer according to the present invention.

FIG. 1 is a cross-sectional view showing a contact relationship with respect to a susceptor in a method for manufacturing a silicon epitaxial wafer according to the present invention in detail. Further, FIG. 3 is a view for explaining a process flow in the method for manufacturing the silicon epitaxial wafer according to the present invention.

According to the method for manufacturing the silicon epitaxial wafer of the present invention, a silicon oxide film 4 is first formed on an entire back surface of a prepared silicon substrate W at a step A.

The silicon substrate W prepared at this moment is not restricted in particular.

Although formation of the silicon oxide film 4 is not restricted in particular and can be carried out by a thermal oxidation method, performing the formation by a CVD method (Chemical Vapor Deposition) is preferable.

When the silicon oxide film is formed on the entire back surface of the silicon substrate by the CVD method in this manner, a CVD silicon oxide film can be readily formed, and the silicon oxide film can be easily removed without scratching a silicon epitaxial wafer after growing an epitaxial layer. Furthermore, for example, when the substrate contains a dopant, since the silicon oxide film formed on the back surface (a surface on which the epitaxial layer is not formed) by the CVD method is dense, the dopant contained in the substrate can be prevented from being outwardly diffused during the growth of the epitaxial layer, and a so-called change in specific resistance of the epitaxial layer due to autodoping can be suppressed.

Conditions of the CVD method are not restricted, and a CVD method carried out at a normal pressure can be applied, for example.

Figure 2:
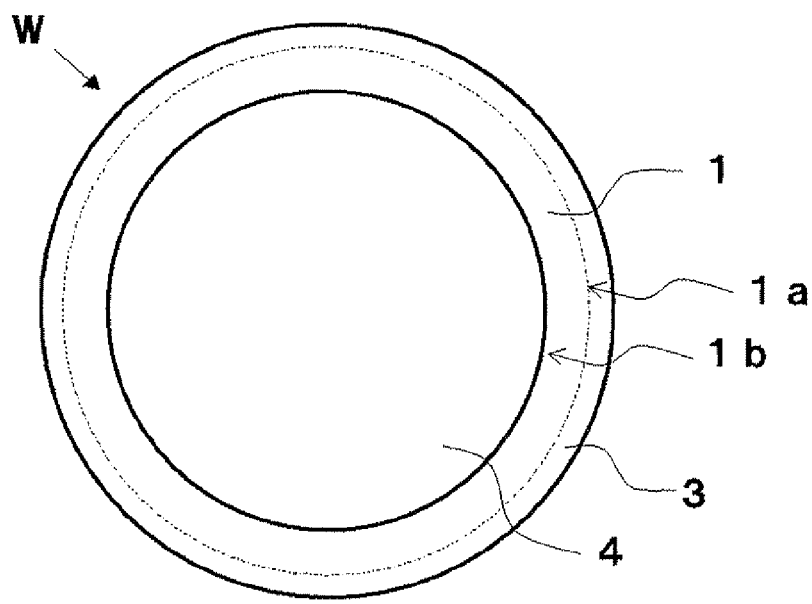
FIG. 2 is a schematic view showing a substrate from a back side.

Subsequently, at a step B, as shown in FIG. 1 and FIG. 2, at least the silicon oxide film 4 formed on an edge portion 3 of the silicon substrate W is removed. FIG. 2 is a schematic view showing from the back side the substrate W immediately after end of the removal of the silicon oxide film.

Although the silicon oxide film on the inner side apart from the edge portion may be also removed, at least a portion that is in contact with the susceptor must be left. That is because this silicon oxide film prevents the susceptor from directly coming into contact with the substrate.

Moreover, when the silicon oxide film on the inner side of the substrate is excessively removed, a large amount of dopant may be outwardly diffused from the back surface at the time of growing the epitaxial layer if the substrate contains the dopant, e.g., boron at a high concentration, and autodoping of the silicon epitaxial layer may possibly advance. Therefore, when growing the epitaxial layer on the substrate having concern of autodoping, determining a silicon oxide film removing region to be at most 1 mm from an outer periphery 1a of the back main surface toward the inner side 1b is preferable.

When the substrate contains a dopant in this manner, preventing removal of the silicon oxide film formed on the back main surface from reaching the extremely inward side enables suppressing autodoping of the epitaxial layer during the growth.

The removal of the silicon oxide film 4 can be carried out by, e.g., disposing a mask on the silicon oxide film to be left and immersing it in HF or by overlapping front and back main surfaces of a plurality of substrates each having the silicon oxide film formed on the back surface thereof and immersing edge portions in a batch of, e.g., 100 substrates in an HF aqueous solution. However, when further reducing scratches on each manufactured silicon epitaxial wafer, it is preferable to perform the step B of removing the silicon oxide film by using mirror polishing.

When the silicon oxide film 4 formed on the edge portion 3 of the silicon substrate W is removed by mirror polishing, the oxide film can be assuredly removed, and the silicon epitaxial wafer having no polysilicon growth at an epitaxial growth step can be manufactured. Additionally, since the edge portion is smoothened, abnormal growth of polysilicon called a nodule can be avoided on the edge portion at the epitaxial step.

Then, at a step C, the silicon substrate W is placed on a susceptor 16 through the silicon oxide film 4 formed at the step B.

At this time, as the susceptor 16, a susceptor having a cylindrical convex portion formed at the center of a pocket thereof can be used as shown in FIG. 3(C). Further, the susceptor used in the present invention may have, e.g., a ring-like convex portion formed at the center.

However, the susceptor 16 used in the present invention must support the substrate W through the silicon oxide film 4. Therefore, it is not possible to use a susceptor having a configuration that a concave portion is further formed on the inner side of a concave portion as a pocket and a step of the pocket is utilized to support at the edge portion or the range of 1 mm from the outer periphery of the back main surface toward the inner side of the substrate W.

Accordingly, even in case of the susceptor having the cylindrical or ring-like convex portion formed at the center of the pocket, it is preferable to use the susceptor having a configuration that a diameter of the cylinder or the ring of the convex portion is approximately 1 mm to 2 mm smaller than the remaining silicon oxide film.

In regard to a placing position of the silicon substrate W on the susceptor, the substrate W is placed so as to be supported at the center of the pocket as shown in FIG. 3.

Subsequently, at a step D, an epitaxial layer 5 is grown on a front surface 2 of the silicon substrate W while holding the silicon substrate W on the susceptor 16 through the silicon oxide film 4.

Figure 4:
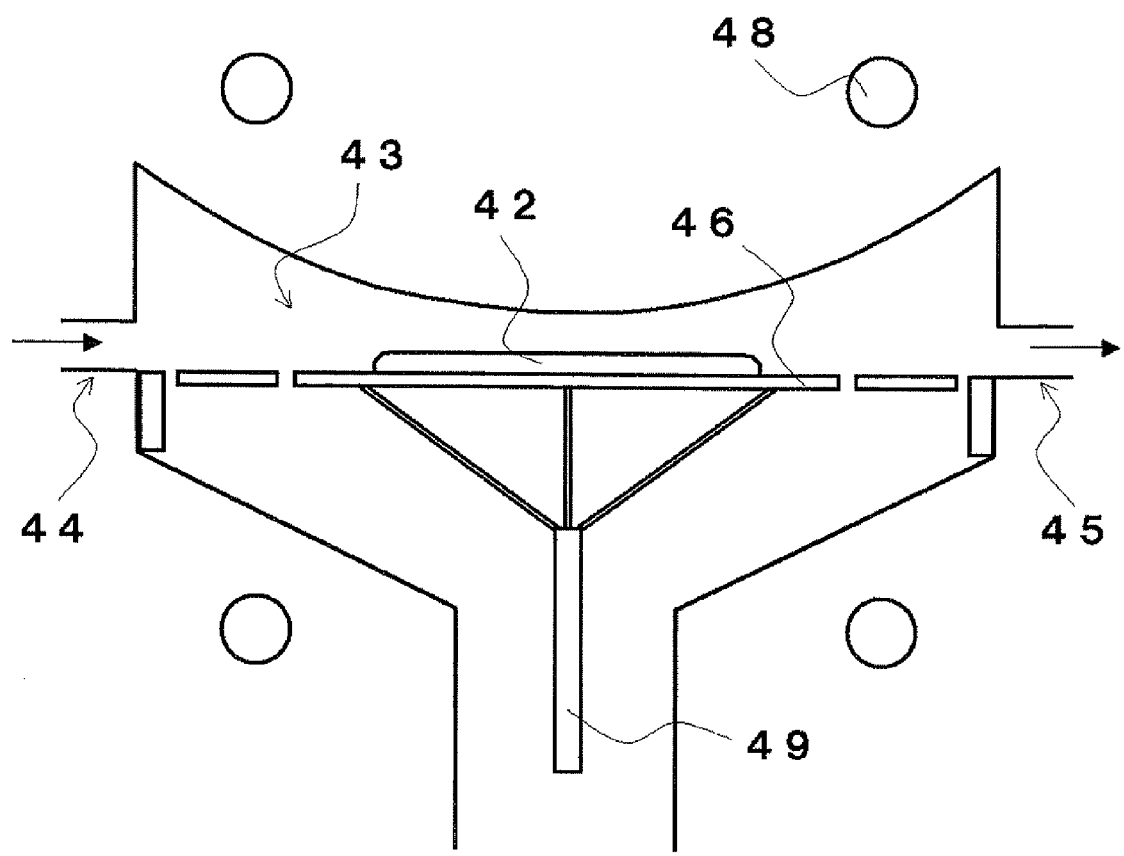
FIG. 4 is a schematic view of a general single-wafer processing epitaxial growth apparatus.

The epitaxial layer 5 can be grown by arranging the above-described susceptor in a reaction chamber of such a single-wafer processing epitaxial growth apparatus as introduced in FIG. 4, holding the silicon substrate having the oxide film formed on the back surface, supplying a carrier gas (hydrogen) alone, increasing a temperature to 1130° C. as a reaction temperature of a raw material gas while rotating the substrate W, then setting a growth temperature of the epitaxial layer to approximately 1130° C., and supplying trichlorosilane and hydrogen as a reactant gas at a fixed flow quantity from a gas introduction opening. A reaction time and the flow quantity of the raw material gas are appropriately changed in accordance with a thickness of the epitaxial layer to be formed.

After this step D, a step E of removing all of the silicon oxide film 4 from the back surface is carried out, thereby manufacturing the silicon epitaxial wafer 10. When the silicon oxide film 4 must be left on the back surface of the substrate W, this step E may be omitted.

When the substrate having the silicon oxide film on the back main surface of the substrate W is placed on the susceptor through the silicon oxide film to form the epitaxial layer in this manner, the epitaxial layer can be grown without generating contact scratches on the back surface of the silicon substrate due to the susceptor, and particle generation from the substrate can be suppressed in subsequent processes. Therefore, a yield ratio of wafer manufacture or even device manufacture and a quality can be improved.

Furthermore, since the silicon oxide film does not remain on the edge portion, unwanted polysilicon growth during the epitaxial layer growth can be suppressed.

The silicon epitaxial wafer manufactured by the method according to the present invention described above is the silicon epitaxial wafer 10 having the epitaxial layer 5 grown on the silicon substrate W, and at least the edge portion 3 and a region extending 1 mm from the outer periphery 1a of the back main surface toward the inner side 1b of the silicon substrate W has no contact scratches generated due to the susceptor.

In such a silicon epitaxial wafer having no contact scratches generated due to the susceptor, particle generation from the substrate can be suppressed even in subsequent processes. Therefore, a yield ratio of wafer manufacture and even device manufacture and a quality can be improved.

In particular, the silicon epitaxial wafer 10 having no contact scratch due to the susceptor on the entire back surface of the silicon substrate is preferable, and such a silicon epitaxial wafer can assuredly suppress particle generation from the contact scratches on the substrate due to the susceptor.

Moreover, above-mentioned silicon epitaxial wafer having the edge portion of the silicon substrate W as a mirror finished surface is preferable, whereby growth of polysilicon can be assuredly avoided, growth of nodules or crowns can be prevented, and particle generation from the edge portion of the substrate can be avoided.

EXAMPLE

The present invention will now be more specifically explained based on examples and comparative examples according to the present invention, but the present invention is not restricted thereto.

Examples 1 and 2

Each silicon epitaxial wafer was manufactured in a flow depicted in FIG. 3.

First, a silicon single crystal substrate having an edge portion 3 with a width of 0.5 mm which is formed of p-type boron-doped ($6 \times 10^{18}$ atoms/cm$^3$) p$^+$ silicon single crystal having a diameter of 300 mm was prepared as a substrate W. At this time, a back main surface 1 of the substrate W has a diameter of 299 mm.

Then, a CVD silicon oxide film having a thickness of 3500 Å (350 nm) was formed on the entire back surface of the silicon substrate W by the CVD method at a normal pressure.

Subsequently, the CVD oxide film formed on an edge portion and a region extending 1 mm from an outer periphery of the back main surface toward an inner side of the substrate was removed by mirror polishing. Therefore, a diameter of the CVD oxide film 4 formed on the back main surface of the substrate became approximately 297 mm.

Then, the silicon substrate W was placed on a susceptor 16 through the silicon oxide film 4.

At this time, as the susceptor in Example 1, one having a configuration that a pocket has a diameter of 302 mm and a cylindrical convex portion having a diameter of 280 mm and a height of 0.09 mm is provided at the center of the pocket was used (see FIG. 3(C)). Further, as the susceptor in Example 2, one having a configuration that a pocket has a diameter of 302 mm and a ring-like convex portion having an external diameter of 296 mm, an internal diameter of 279 mm and a height of 0.09 mm is provided at the center of the pocket was used (not shown).

Subsequently, a carrier gas (hydrogen) alone was supplied into a reaction chamber of a single-wafer processing epitaxial growth apparatus, a temperature was increased to 1130° C. as a reaction temperature of a raw material gas while rotating the substrate W, a growth temperature of an epitaxial layer was set to approximately 1130° C., and trichlorosilane (SiHCl$_3$) with a flow quantity of 10 SLM and hydrogen (H$_2$) with a flow quantity of 50 SLM were supplied as a reactant gas from a gas introduction opening. Furthermore, an epitaxial layer having a thickness of approximately 5 μm was formed on the substrate W.

Then, the CVD oxide film 4 formed on the back surface of the substrate W was removed by using HF.

As a result, a silicon epitaxial wafer having no contact scratch generated due to the susceptor on the entire back surface of the substrate W could be manufactured.

Comparative Example 1

First, a substrate W having the same specification as that of the substrate W prepared in Examples was prepared (no CVD oxide film on a back surface). Then, the substrate W was placed on a step portion having an inclination (an angle of approximately 1°) in a pocket of a susceptor, and the substrate was supported in the range of approximately 1 mm from an outer periphery of the back main surface of the substrate.

Subsequently, a carrier gas (hydrogen) alone was supplied into a reaction chamber of a single-wafer processing epitaxial growth apparatus, a temperature was increased to 1130° C. as a reaction temperature of a raw material gas while rotating the substrate W, a growth temperature of an epitaxial layer was set to approximately 1130° C., and trichlorosilane (SiHCl$_3$) with a flow quantity of 10 SLM and hydrogen (H$_2$) with a flow quantity of 50 SLM were supplied as a reactant gas from a gas introduction opening. Moreover, an epitaxial layer having a thickness of approximately 5 μm was formed on the substrate W.

As a result, in the thus manufactured silicon epitaxial wafer according to Comparative Example 1, observing the back surface of the substrate by using a halogen lamp, many scratches were discovered at contact positions with respect to the susceptor.

Comparative Example 2

First, a substrate W having the same specification as that of the substrate W prepared in Comparative Example 1 was prepared. Then, the substrate W was placed on a susceptor having a configuration that a pocket has a diameter of 302 mm and a ring-like convex portion having an external diameter of 280 mm, an internal diameter of 279 mm and a height of 0.09 mm is provided at the center of the pocket.

Subsequently, a carrier gas (hydrogen) alone was supplied into a reaction chamber of a single-wafer processing epitaxial growth apparatus, a temperature was increased to 1130° C. as a reaction temperature of a raw material gas while rotating the substrate W, a growth temperature of an epitaxial layer was set to approximately 1130° C., and trichlorosilane (SiHCl$_3$) with a flow quantity of 10 SLM and hydrogen (H$_2$) with a flow quantity of 50 SLM were supplied as a reactant gas from a gas introduction opening. Additionally, an epitaxial layer having a thickness of approximately 5 µm was formed on the substrate W.

As a result, in the manufactured silicon epitaxial wafer, contact scratches generated due to the susceptor were observed on the back main surface of the substrate. Further, the epitaxial layer was grown on contact portions, and many portions where protrusions of silicon having a height of approximately 57 nm were produced were also observed from the back main surface of the substrate.

Comparative Example 3

First, a substrate W having the same specification as that of the substrate W prepared in Comparative Example 1 was prepared.

Then, a CVD silicon oxide film having a thickness of 3500 Å (350 nm) was formed on an entire back surface of a silicon substrate at a normal pressure by the CVD method.

Subsequently, the silicon substrate was placed on the susceptor through a silicon oxide film.

At this time, as the susceptor, one having a configuration that a pocket has a diameter of 302 nm and a cylindrical convex portion having a diameter of 296 mm and a height of 0.09 mm is provided at the center of the pocket was used.

Then, a carrier gas (hydrogen) alone was supplied into a reaction chamber of a single-wafer processing epitaxial growth apparatus, a temperature was increased to 1130° C. as a reaction temperature of a raw material gas while rotating the substrate W, a growth temperature of an epitaxial layer was set to approximately 1130° C., and trichlorosilane (SiHCl$_2$) with a flow quantity of 10 SLM and hydrogen (H$_2$) with a flow quantity of 50 SLM were supplied as a reactant gas from a gas introduction opening. Further, an epitaxial layer having a thickness of approximately 5 µm was formed on the substrate W.

Subsequently, the CVD oxide film formed on the back surface of the substrate W was removed by using HF.

As a result, although a silicon epitaxial wafer was manufactured, since the CVD oxide film remained on an edge portion, a large amount of polysilicon was produced during growth of the epitaxial layer, and acquisition of a wafer that can be shipped as a product was failed.

The following Table 1 shows a result of observing scratches on the back surface of each silicon epitaxial wafer manufactured according to each of above-mentioned Examples 1 and 2 and Comparative Examples 1 to 3.

TABLE 1

| | Oxide film on back surface | Shape of susceptor | Generation of contact scratches |
|---|---|---|---|
| Example 1 | Part of back main surface | Cylindrical convex portion is provided in pocket | None |
| Example 2 | Part of back main surface | Ring-like convex portion is provided in pocket | None |
| Comparative Example 1 | None | Step supporting substrate in region of approximately 1 mm from outer periphery is provided in pocket | Many contact scratches are present on susceptor contact portion within approximately 1 mm from outer periphery of back main surface |
| Comparative Example 2 | None | Ring-like convex portion is provided in pocket | Many contact scratches are present on susceptor contact portion on back main surface |
| Comparative Example 3 | Entire back surface including edge portion | Cylindrical convex portion is provided in pocket | None |

Based on the result shown in Table 1, the method for manufacturing the silicon epitaxial wafer according to the present invention enables growing the epitaxial layer without generating the contact scratches due to the susceptor on the back surface of the silicon substrate. Therefore, even in subsequent processes, particle generation from the substrate can be suppressed, a yield ratio of wafer manufacture or subsequent device manufacture and a quality of a wafer product can be improved.

It is to be noted that the present invention is not restricted to the foregoing embodiment. The embodiment is just an exemplification, and any examples that have the substantially the same configurations and demonstrate the same functions and effects as the technical scope described in claims of the present invention are included in the technical scope of the present invention.

The invention claimed is:

1. A method for manufacturing a silicon epitaxial wafer by placing a silicon substrate containing a dopant on a susceptor to grow an epitaxial layer, the method comprising at least:
    a step of forming a silicon oxide film on an entire back surface of the silicon substrate;
    a step of removing the silicon oxide film formed on an edge portion of the silicon substrate and the silicon oxide film formed at a region extending at most 1 mm from an outer periphery toward an inner side of a back main surface of the silicon substrate by mirror polishing; and
    a step of placing the silicon substrate on the susceptor through the silicon oxide film,
    wherein the epitaxial layer is grown on the silicon substrate while holding the silicon substrate on the susceptor through the silicon oxide film.

2. The method for manufacturing the silicon epitaxial wafer according to claim 1, wherein the step of forming the silicon oxide film is carried out by a CVD method.

* * * * *